US008435650B2

(12) United States Patent
Mehrtens et al.

(10) Patent No.: US 8,435,650 B2
(45) Date of Patent: May 7, 2013

(54) FINE LAMINAR BARRIER PROTECTIVE LAYER

(75) Inventors: Andree Mehrtens, Grunenplan (DE); Thomas Küpper, Bad Gandersheim (DE); Margareta Hamel, Ebergotzen (DE); Christoph Moelle, Bad Gandersheim (DE)

(73) Assignee: Schott AG (DE)

( * ) Notice: Subject to any disclaimer, the term of this patent is extended or adjusted under 35 U.S.C. 154(b) by 1085 days.

(21) Appl. No.: 11/721,802

(22) PCT Filed: Dec. 19, 2005

(86) PCT No.: PCT/EP2005/013644
§ 371 (c)(1),
(2), (4) Date: Jan. 30, 2009

(87) PCT Pub. No.: WO2006/063855
PCT Pub. Date: Jun. 22, 2006

(65) Prior Publication Data
US 2009/0142524 A1 Jun. 4, 2009

(30) Foreign Application Priority Data

Dec. 17, 2004 (DE) .......................... 10 2004 061 464

(51) Int. Cl.
*B32B 3/20* (2006.01)
*B32B 27/32* (2006.01)
*B32B 17/06* (2006.01)
*B32B 9/00* (2006.01)
*B32B 19/00* (2006.01)

(52) U.S. Cl.
USPC ........... 428/698; 428/188; 428/220; 428/426; 428/702

(58) Field of Classification Search .................. 428/188, 428/220, 426, 698, 702
See application file for complete search history.

(56) References Cited

U.S. PATENT DOCUMENTS

| 4,486,487 | A | | 12/1984 | Skarp |
| 4,634,919 | A | * | 1/1987 | Yuge et al. ..................... 313/113 |
| 4,983,001 | A | * | 1/1991 | Hagiuda et al. ............... 359/359 |
| 5,113,109 | A | * | 5/1992 | Kawakatsu et al. ........... 313/112 |
| 5,744,227 | A | | 4/1998 | Bright et al. |
| 5,900,285 | A | | 5/1999 | Walther et al. |
| 5,982,078 | A | * | 11/1999 | Krisl et al. ..................... 313/112 |
| 6,356,020 | B1 | * | 3/2002 | Cottaar ......................... 313/635 |
| 6,680,572 | B1 | * | 1/2004 | Morel ........................... 313/574 |

FOREIGN PATENT DOCUMENTS

| DE | 2 223 670 A1 | 3/1973 |
| DE | 44 22 778 A1 | 1/1995 |
| DE | 102 58 681 A1 | 2/2004 |
| DE | 196 43 039 A1 | 4/2008 |

(Continued)

OTHER PUBLICATIONS

International Preliminary Examination Report, PCT/EP2005/013644, mailed Dec. 19, 2005.

*Primary Examiner* — Jonathan Langman
(74) *Attorney, Agent, or Firm* — Kaplan Breyer Schwarz & Ottesen, LLP

(57) ABSTRACT

In order to provide a thermostable and highly effective barrier coating on a substrate, and to protect the substrate against the effect of harmful gas components even at high temperatures, the invention provides a coated substrate comprising a barrier coating having a multiplicity of consecutive individual layers respectively of a kind differing from or similar to a neighboring individual layer, the individual layers exhibiting a layer thickness of respectively at most 50 nanometers.

28 Claims, 8 Drawing Sheets

FOREIGN PATENT DOCUMENTS

Figure 1A:
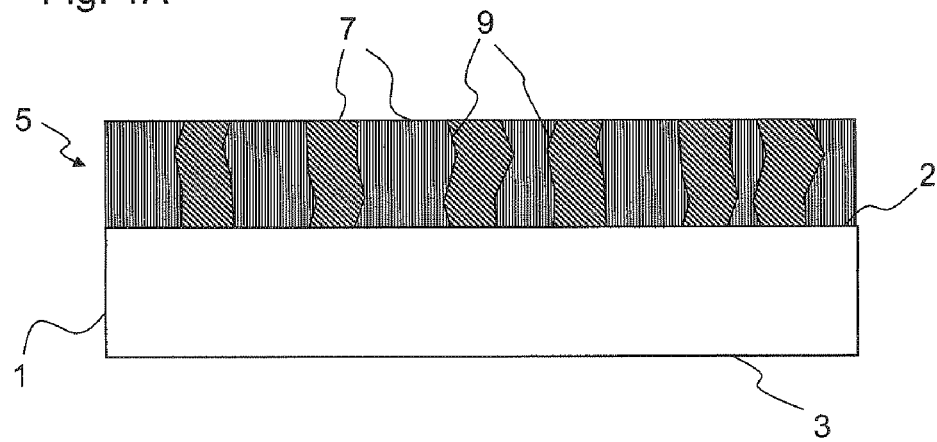

| | | | |
|---|---|---|---|
| EP | 0 909 835 A1 | 4/1999 |
| EP | 1 348 675 A1 | 10/2003 |
| EP | 1 388 593 A2 | 2/2004 |
| WO | 2004/026785 A1 | 4/2004 |
| WO | 2004/067791 A2 | 8/2004 |

* cited by examiner

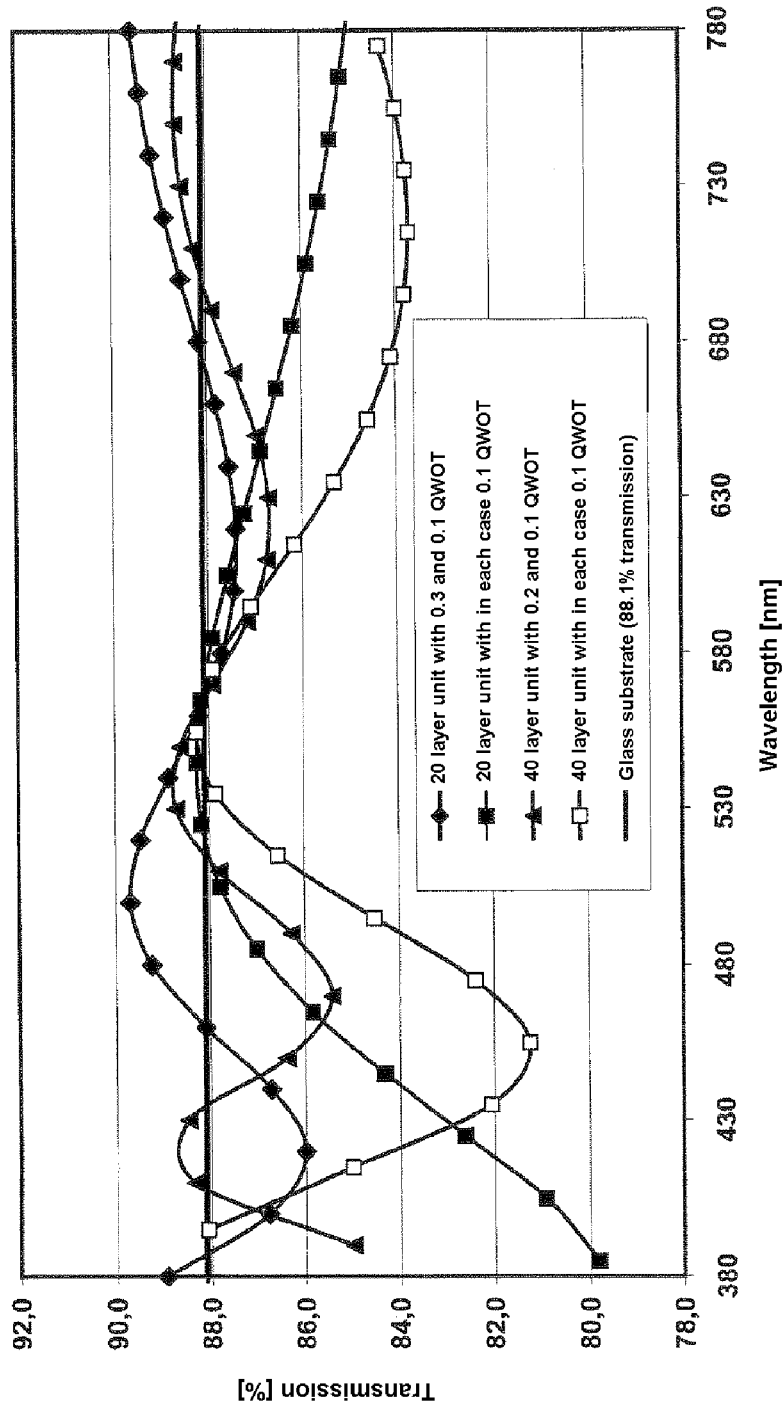

FINE LAMINAR BARRIER PROTECTIVE LAYER

The invention relates in general to barrier layers, in particular the invention relates to a method for producing high temperature-stable barrier layers and products that can be produced therewith.

Up to certain temperatures, in particular up to the deformation point or the glass transition temperature, types of glass are inherently stable. Glass is therefore outstandingly suitable as a transparent separation element of high optical quality, for example in order in the form of a glass vessel, by way of example, to enclose specific gas atmospheres completely, or, in the form of a window, to separate them from other regions.

However, depending on the gas composition it is possible in the event of high temperatures for there to occur even in the case of glass undesired reactions of a chemical or physical nature in which the properties of the glass are disadvantageously influenced. For example, the surface of the glass can become milkily opaque such that the glass alters its optical properties. Again, the glass can crystallize at least partially, and this influences its strength and leakproofness disadvantageously. Thus, glasses and glass ceramics, for example, can be attacked by sulfur oxides such as are produced in the burning of fossil fuels.

In order to prevent or to slow down these effects, it is possible to apply barrier coatings that protect the surface of the glass substrate against the effect of such harmful gas components. It is known inter alia in this regard to make use of various metal oxides. Such layers are usually deposited using a CVD or PVD method.

However, in the context of the coating parameters that are customarily widespread in production and are generally optimized to high deposition rates in order to reduce production costs, these layers grow in various growth modes, such as columnar, island or layered growth. Depending on the growth mode, specific crystal structures or crystal forms of the growing layers result, or the layers grow in amorphous, partially crystalline or very finely crystalline, in particular submicrocrystalline fashion. Despite the presence of the barrier coating, it is possible in this case, depending on the structure, for there to be a diffusion at least of gas components, or of specific types of gas through the barrier coating, accompanied by a reaction with the glass substrate.

The application of a transparent protective layer to a glass surface in order to protect against undesired chemical interactions with gas atoms from the immediate surroundings is known, for example, from DE 42 08 376 A1. This protective layer is preferably based on UV-transparent fluorides for protecting the inner wall of a gas discharge space of a UV high power radiator against reaction with the gases of a full gas.

However, in the case of the barrier layers known from the prior art, problems arise with regard to thermostability, on the one hand, and to an increased diffusion owing to columnar growth, on the other hand.

It is known from DE 102 42 848 to stabilize the morphology of a coating that has an optical function and/or protective function with regard to temperature effects by inserting thin intermediate layers. However, it is possible here for the morphology of the individual layers, interrupted by thin intermediate layers, of the coating, which is conceived, in particular, as an optically active and/or scratch-resistant coating, still in some circumstances to favor the diffusion of gas components. This can be the case, for example, if the individual layers exhibit columnar or island growth.

It is therefore the object of the invention to specify barrier protective layers on a substrate in the case of which the barrier layer has the maximum possible barrier protective effect for gases or, specifically, for a specified relevant type of glass such that the gas atoms can as far as possible pass through the protective layer to the substrate only with a long time delay, and a barrier protective effect lasting as long as possible is thereby attained. This barrier protective effect should also last as long as possible during use at raised temperatures. This object of providing a particularly thermostable and highly effective barrier coating is, in an extremely surprisingly simple way, already achieved by means of a coated substrate and a method for producing a coated substrate in accordance with the independent claims.

It is a further object to produce layers by deposition, in particular vacuum deposition, that otherwise cannot be deposited using conventional vacuum deposition methods in a comparable phase, or can be deposited only with extreme difficulty, at most. Thus, as an alternative or in addition to a barrier effect, layers deposited in accordance with the invention can also have other effects such as, for example, catalytic or optical effects.

Advantageous refinements and developments are specified in the subclaims.

The inventive approach to a solution resides, in particular, in achieving a targeted influencing of the growth mode of the growing barrier protective layer, for example in the PVD or CVD process, such that a crystal structure and/or morphology results that permits only as low a diffusion as possible of the relevant types of gas through the layer and onto the substrate. This is achieved in a most surprisingly way by subdividing the barrier protective layer into a multiplicity of very thin individual layers of different composition and/or morphology.

One approach to solving the object on which this invention is based is therefore also to provide a method in the case of which a barrier protective layer is produced in such a way that, for example, a column structure which is not desired for the application of a barrier protective layer, or other unfavorable forms of growth are avoided during growth of the layer or layers.

This can be achieved by virtue of the fact that the more or less thick barrier protective layer that is to be applied is interrupted so often in its growth that no more large crystallites can at all be produced. Each started thin applied layer is immediately interrupted again by a newly started layer of another composition and/or structure such that a multiplicity of very thin individual layers are produced, each layer being interrupted in its crystal growth by the following one. It is therefore impossible for large crystallites to form, and consequently also impossible for morphologies with preferred growth directions such as, for example, columns, to form.

The diameter of the crystallites produced in this case is preferably of the same size or order of magnitude here as the thickness of the individual layers, and can therefore be set in a targeted fashion by the thickness of the consecutively applied different or similar individual layers. The size of the crystallites produced (and therefore the thickness of the individual layers to be applied) is preferably in the submicrocrystallite range in this case, and preferably below 50 nm depending on layer material.

Consequently, the invention provides a coated substrate that comprises a barrier coating having a multiplicity of consecutive individual layers respectively of a king differing from a neighboring individual layer, the individual layers having a layer thickness of respectively at most 50 nanometers.

Such a substrate can be produced according to the invention with the aid of a method for producing a barrier coating on a substrate in the case of which the barrier coating is produced by depositing a multiplicity of consecutive individual layers respectively of a kind differing from a neighboring individual layer and whose layer thickness is respectively at most 50 nanometers.

It is likewise possible also to produce a thick layer from a single material by applying it in the form of many thin individual layers, that is to say, according to the invention, preferably in layers at most 50 nanometers thick in temporally separate individual coating steps in a consecutive fashion. In this way, thick layers are produced with morphologies that cannot be obtained with the aid of a single coating step.

Consequently, the invention also provides a coated substrate that comprises a barrier coating having a multiplicity of consecutive individual layers respectively of a similar kind, the individual layers having a layer thickness of respectively at most 50 nanometers.

According to the invention, such a substrate can be produced with the aid of a method for producing a barrier coating on a substrate in the case of which the barrier coating is produced by depositing a multiplicity of consecutive individual layers respectively of a kind similar to neighboring individual layers and whose layer thickness is respectively at most 50 nanometers. The similar layers can also exhibit different layer thicknesses in this case.

In order in this case to produce morphologies that cannot be implemented in a single coating operation, or can only be implemented with great difficulty, it is possible for a gas composition other than that which is used for the coating operation to be introduced into the coating apparatus between the coating steps for coating the individual layers, and then for the morphology of the previously grown individual layer to be influenced in a targeted manner by using a plasma treatment to input energy. In particular, it has proved to be advantageous in this case to introduce a process gas including a reactive gas or consisting of such a reactive gas. Such a reactive gas can, in particular, be oxygen or contain gaseous oxygen as a component. Of course, such plasma treatment can also be used in the deposition of individual layers differing from one another.

The plasma can be used to ionize the oxygen and bring it into a high energy excitation state, as a result of which a very large amount of energy can be transferred to the previously applied layer when contact is made with it. The energy deposited in the thin layer can heat up the latter in the short term to high temperatures, and thus cause transformations into morphological states that cannot be achieved by means of a pure coating process with deposition of a thick individual layer.

It is then expedient in this case for the steps of the deposition of an individual layer and the plasma treatment of this individual layer to be repeated several times in order to produce thicker layers from different or similar individual layers with layer thicknesses of up to preferably at most 50 nanometers.

It is also preferred to use pulsed electromagnetic energy during the plasma treatment as also used in the same or a similar way for plasma-pulse-induced deposition (PICVD). It is possible with the aid of pulsed electromagnetic energy—in particular pulsed microwave or high frequency radiation—to irradiate a large amount of electromagnetic energy during the pulse in conjunction with low mean energy. The coating can therefore be treated with a very high energy plasma without excessively heating up the substrate. Undertaking to deposit the layers by means of PICVD is then also particularly obvious.

Using the plasma treatment, it is possible, for example, for an amorphous individual layer grown under the selected process parameters to be partially or completely crystallized through short-term generation of high temperatures in the surface of the layer by means of the plasma treatment. It is possible here, inter alia, to perform nucleation for the crystallization or partial crystallization, and the layer can then be transformed into a crystalline or partially crystalline layer within a short time—during or else after the plasma treatment. Such an individual layer whose morphology has been influenced can thereby exhibit a clearly different, preferably targeted higher diffusion barrier effect than the previously deposited, uninfluenced amorphous individual layer. A corresponding statement is then also valid for the thicker layer built up from or with the aid of such individual layers.

It is then possible by using a sequence of steps comprising coating with an amorphous individual layer, influencing morphology in the form of a crystallization by means of the plasma treatment, etc.—which alternate with one another—to produce a thick complete layer that is crystalline overall or partially crystalline and has been produced by a multiplicity of individual layers that are respectively applied amorphously at first and always followed thereafter by crystallization.

Conversely, for example, a crystalline layer grown under the selected process parameters can be partially fused by the plasma treatment and the short-term high temperatures, generated thereby, in the surface of the previously grown individual layer. It is then possible by switching off the electromagnetic energy to produce a rapid cooling such that the layer is transformed virtually completely or at least partially into an amorphous state in this case without crystallizing. Owing to the insufficient time for nucleation during cooling, the fused layer is therefore frozen in a vitreous or glassy, for example amorphous, state. Such an amorphous layer can also exhibit a diffusion barrier effect which is clearly different from, in particular also clearly higher than, a crystalline layer of the same composition. It is then possible to produce an overall amorphous, or partially amorphous layer by using a sequence of steps that alternate with one another and comprise depositing a crystalline individual layer and influencing morphology in the form of a transformation into an at least partially amorphous layer, etc.

Furthermore, it is also possible for individual layers having a specific crystalline morphology to be transformed into an individual layer having a different morphology by means of the plasma treatment. Thus, it is possible to cause in titanium oxide individual layers a transformation between the anatase and rutile crystal phases. Again, specific growth structures such as columnar, island or layered growth, and also preferred directions in the crystal orientation in the layers can be influenced by the plasma treatment. Such layers grown in different growth modes do not differ in principle in their crystal structure, that is to say in the relative position and the spacing of the atoms, but only in the relative position of the crystal axes and crystal surfaces in relation to the surface plane and/or in their relative density, that is to say their degree of porosity. Targeted influencing of the diffusion barrier effect is possible in this case even given a transformation of the morphology of crystalline layers.

In the present examples, that is to say deposition of amorphous individual layers, respectively having layer thicknesses of at most 50 nanometers, and respectively subsequent crystallization by plasma treatment, or deposition of crystalline individual layers respectively having layer thicknesses of at most 50 nanometers and respective subsequent transformation into at least partially amorphous individual layers by the plasma treatment, as well as the transformation into another crystalline phase or morphology, it is respectively possible to generate in a targeted fashion in the complete layer morphologies that cannot be thus achieved by means of a single deposition step with deposition of an appropriately thick layer.

Even in the case when layers of similar type are deposited, it is assumed that the individual layers also remain distinguishable in general in the thicker layer built up from these layers, because of the interruption of the coating operation and of the renewed deposition of an individual layer. In particular, it is also assumed in the case of a subsequent plasma treatment that the plasma treatment has a different effect on the surface of an individual layer than on regions near the interface with the previously deposited layer lying therebelow. The differences in morphology attendant thereon generally remain capable of being determined even after termination of the production of the layer, for example in the case of an electron microscope analysis of the layer at the fracture edge.

An inventive layer that is deposited in many individual steps as a sequence of thin similar or different individual layers can, furthermore, also exhibit other properties in addition, or as an alternative, to a barrier effect. What is in mind here is, inter alia, also a catalytically active, in particular also photocatalytically active and/or hydrophilic layer. Thus, an inventive coating can exhibit titanium oxide-containing photocatalytically active individual layers. If the coating is built up from such similar layers, phases and morphologies of the layer that are particularly catalytically active can be stabilized by the inventive deposition in many fine laminar layers. The invention can then be used, for example, to produce titanium oxide layers in the form of layer stacks with alternating thin anatase and rutile layers. A plasma treatment can then be used to generate the desired crystal phase. Again, a number of consecutive similar photocatalytically active thin individual layers can be deposited on one another. It is optionally possible here to interpose a plasma treatment in order to produce the desired morphology and/or phase of the layers.

An inventively produced catalyst having a substrate and a multiplicity of thin individual layers of the abovenamed layer thicknesses can be used, inter alia, as an air filter, for example in the automobile sector for filtering air and/or exhaust gas in motor vehicles.

By contrast with known barrier protective layers, in accordance with the invention it is not the case that a function layer is subdivided by one or a few thin intermediate layers, but that the function layer, that is to say the entire barrier protective layer, is built up from a multiplicity of very thin individual layers. Owing to this inventive fine laminar layer structure, not only is a subsequent transformation of the morphology under the influence of temperature prevented, but, moreover, there is generated in a targeted fashion from the very start during production a layer morphology that inherently exhibits the smallest possible diffusion effect for specific types of gas through the layer, and also maintains this barrier protective effect even at high temperatures. The increased thermostability of an inventive barrier coating is based on the surprising finding that such thin layers are not susceptible, or scarcely susceptible to phase transformations or other changes in morphology.

The barrier effect of the inventive coating can be yet further improved by yet smaller layer thicknesses of the individual layers. Thus, in accordance with a preferred embodiment of the invention, a coated substrate is provided in the case of which at least one of the individual layers, preferably a number of individual layers, in particular a number of consecutive individual layers, in particular also all individual layers of the barrier coating exhibit a layer thickness of at most 10 nanometers, or are deposited with these layer thicknesses. In accordance with yet another development of the invention, a coated substrate is provided in the case of which at least one of the individual layers, preferably a number of individual layers, in particular a number of consecutive individual layers, in particular also all individual layers of the barrier coating exhibit a layer thickness of at most 2 nanometers, preferably also less than 2 nanometers, or are deposited with such layer thicknesses. Having such small individual layer thicknesses of less than 10 nanometers, or even less than 2 nanometers, the crystallites produced are already of the order of magnitude of the elementary cell, and so it is thereby possible for typical grain boundaries not even to be capable of forming in a specific direction.

Particularly suitable for producing the inventively very thin individual layers are various vacuum deposition methods. For example, it is also possible to combine a number of vacuum deposition methods. A vacuum deposition method is understood as a method in which a coating is undertaken in an at least partially evacuated environment. The production of at least a portion of the individual layers is preferably by means of vacuum deposition methods such as plasma-pulse-supported vapor phase deposition and/or sputtering on. For example, plasma-pulse-supported vapor phase deposition (PICVD) permits good control of the layer thickness by counting off the plasma pulses, since the number of the plasma pulses is essentially proportional to the deposited layer thickness. Sputtering can also be used to produce very thin layers, such as are required according to the invention, in a fashion capable of being reproduced effectively.

In the applied layer packet of the inventive barrier coating, an individual layer of the barrier coating can differ from a neighboring individual layer in its chemical composition and/or in its morphology. A differing crystal structure is one possibility of a morphology differing from a neighboring layer. In this case, one or more of the individual layers can exhibit crystalline, in particular very finely crystalline or partially crystalline structure.

One more possibility is that the individual layers differ in their growth mode. By way of example, layers with incipient columnar growth and layered growth can be stacked one upon another.

The barrier coating of at least one partial layer packet can thus also comprise individual layers of the same composition but different morphology, in order to achieve a barrier effect and thermal stability that are substantially improved in comparison to a thick individual layer.

In order to produce such layer packets, it is possible in accordance with one embodiment of the inventive method for consecutive individual layers of different morphology advantageously to be deposited by changing the process parameters from one layer to a subsequent layer. Possible examples of the variation of the process parameters are, inter alia:

different partial pressure of the precursor gas in the case of PICVD coating, different temperature owing to a different microwave power in the case of the PICVD method, changing the pulse energy and/or pulse duration and/or the duty ratio of the microwave pulses in the case of PICVD coating, varying the deposition rate, and changing the gas density in the case of cathode sputtering.

In accordance with one more development of the invention, it is provided that at least one of the individual layers exhibits an amorphous structure. It is certainly true that should an individual layer produced under the set process parameters grow amorphously of its own accord, it is also possible for no crystal structures such as columns to form, but the diffusion effect of amorphous layers is often not so good as that of crystalline layers of suitable morphology, since owing to their lesser packing density amorphous structures are often inherently not so dense as those of crystalline structures, and therefore, because of their increased porosity, also do not have such a high diffusion blocking effect in relation to gas atoms. However, a particular advantage of an amorphous individual layer is that it effects a particularly good interruption of the growth mode of neighboring individual layers. Amorphous layers are therefore particularly well suited in conjunction with other neighboring crystalline or partially crystalline layers.

Consequently, one advantageous embodiment of the invention provides a coated substrate in the case of which the barrier coating comprises at least one partial layer packet having amorphous and neighboring, at least partially crystalline, preferably very finely crystalline layers. To this end, it is also possible as a development for at least one partial layer packet of the barrier coating to be deposited having two at least partially crystalline, preferably very finely crystalline layers of a different composition, between which respectively one amorphous layer is arranged.

One advantageous development of the invention provides, furthermore, that the barrier coating comprises at least one partial layer packet having alternating layers of a different nature. Such layer packets formed as alternating layers can be produced particularly easily by the alternating deposition of two types of layer.

It is particularly preferred for the barrier coating to be transparent. This can then, in particular, be used in conjunction with transparent substrates. In order to achieve an optically inconspicuous barrier coating, the transparency of the barrier coating can advantageously also correspond to the transparency of the substrate. Success is thereby achieved in providing barrier coatings in the case of which the light transmission through a substrate coated with the barrier coating deviates in the visible spectral region by at most 5% from the transmission of a substrate without the barrier coating.

Optical inconspicuousness of the barrier coating can also be achieved, in particular, by arranging that the refractive index of the barrier coating corresponds to the refractive index of the substrate surface, or deviates therefrom by at most 5%. The refractive index of the barrier coating is to be understood here as an effective refractive index. The effective refractive index is yielded here from the interaction of the individual layers. In general, the effective refractive index can be set, for example, as a mean value, weighted with the layer thickness of the individual layers, of the refractive indices of the individual layers.

In accordance with another development of the invention, the thickness of at least one partial layer packet and the effective refractive index of the latter can be dimensioned such that the barrier coating acts in an antireflective fashion. To this end, it is possible, in particular, to provide an antireflection layer system having the barrier coating, the entire layer system of the antireflection layer system acting in an antireflective fashion and at least one layer of the antireflection layer system comprising a partial layer packet that has a multiplicity of thin consecutive layers with an average thickness of at most 50 nanometers, or being replaced by such a partial layer system having a multiplicity of consecutive individual layers with an average thickness of at most 50 nanometers, preferably on average 10 nanometers, and whose effective refractive index is dimensioned such that the entire layer system with the barrier coating acts overall in an antireflective fashion.

In order to fulfill the requirements of the barrier coating as to thermal stability and barrier effect, it is particularly preferred for at least one of the individual layers, preferably all the individual layers, to contain at least one inorganic oxide.

In particular, it is preferred to deposit inorganic oxide layers. Suitable oxides are, in particular, $TiO_2$, $ZrO_2$, $SiO_2$, $Al_2O_3$, $Nb_2O_5$, $Ta_2O_5$, $HfO_2$. Of course, these oxides can also be deposited in a fashion combined with one another as mixed oxide individual layers.

The increased thermal stability of the inventive barrier coating is, as has already been set forth above, based on the effect that such thin layers of an inventive barrier coating made from correspondingly small crystallites scarcely still incline to changes in morphology even under persistent thermal stress, and therefore are clearly more stable in comparison to thicker layers. Owing to the small size of the crystallites, a particularly good barrier effect is also achieved, since large interfaces on the crystallites that run in the direction of the substrate are avoided. This finding is also the basis of a further embodiment of the invention with which it is surprisingly possible to provide amorphous substrate materials in a simple way with a barrier layer.

To this end, the invention provides a substrate having a barrier layer, the substrate exhibiting an amorphous structure, and a barrier layer with crystallized substrate material with an average crystallite size of at most 50 nanometers being arranged on at least one surface of the substrate. Such a substrate with a barrier layer can be produced with the aid of a method in the case of which a substrate with amorphous structure is provided and on at least one surface of the substrate a barrier layer is produced by crystallizing the substrate material with correspondingly small crystallite sizes.

In a departure from the above-described embodiments of the invention, the barrier layer is thus formed here from the substrate material itself. In comparison to crystalline layers, amorphous layers furthermore frequently have a poorer barrier effect. A barrier effect for amorphous substrates is then, according to the invention, surprisingly found in a simple way by transforming a thin surface layer into a crystalline phase.

In the case of this embodiment of the invention as well, it is possible to achieve an even better barrier effect with even smaller crystallites. Thus, it is provided according to a development of this embodiment of the invention that the barrier layer with crystallized substrate material exhibits crystallites of on average at most 10 nanometers, or even of only at most 2 nanometers.

Moreover, according to the invention there is the possibility, in turn, for such a barrier layer with an additional barrier coating to be further improved in accordance with the other embodiments of the invention with a fine laminar structure, or a sequence of thin individual layers. This embodiment of the invention can be implemented in a particularly advantageous way in the case of a substrate with amorphous metal oxide. Such substrates such as, in particular, amorphous silicon oxide are in wide use where both transparency and thermal stability are the goal. By means of the invention, it is then possible for such substrates to be provided with a diffusion barrier in a simple way by crystallizing amorphous metal oxide, for example by crystallizing amorphous silicon oxide in the region of the substrate near the surface.

A simple and effective method for effecting a crystallization at the surface is superficially heating up the relevant surface of the substrate. Given a sufficiently large temperature gradient toward inner regions of the substrate, crystallization begins in the region of the surface, while the remaining regions remain amorphous or at least largely amorphous.

One possibility of achieving this is plasma treatment of the surface of the substrate. A local and rapid input of energy at the surface is effected in this way. Owing to the high plasma temperatures, it is thus possible to limit the heating up to regions very near the surface in which crystallization then takes place. An example of such plasma treatment is, in particular, the reactive plasma etching of the surface of the substrate.

There are no restrictions with regard to the selection of the substrate materials. The advantages of the invention are given, however, in conjunction with thermostable materials, in particular, such as glass, glass ceramic, ceramic, metal, various semiconductors or crystalline materials.

The substrates can also be hollow, for example tubular. In this case, it is also possible to carry out internal coating of such substrates by means of the invention.

According to one embodiment of the invention, a hollow substrate can be a lamp bulb or else a tube from which one or more lamp bulbs, or else other vessels, are then produced by heating and pinching the tube. The fine laminar layer for this embodiment of the invention is preferably sufficiently thermostable such that it is not destroyed during heating up for the pinching of the tube. Consequently, a coated substrate is thereby obtained in the form of a tube that is preferably hot pinched after coating with the formation of a sealed cavity.

In general, a number of very thin layers are deposited in order to produce inventive products with coated substrates. If CVD coating and/or a plasma treatment carried out after the coating of an individual layer are/is undertaken, the problem arises in this case that the gas mixtures used for deposition and/or plasma treatment should be capable of being very rapidly changed, in order to achieve a coating speed that is still acceptable in comparison with a deposition of a correspondingly thick individual layer. This problem becomes more acute, in particular, whenever the substrate and/or the reactor of the coating apparatus are small and the gas is thereby prevented from flowing through or slowed down. The object of the invention is therefore also to enable a rapid change of the gas components in a reactor for CVD coating. This object is achieved by an apparatus for CVD coating of substrates, in particular having inventive layer systems, and/or for carrying out the inventive method, in the case of which apparatus a number of gas reservoirs are connected by means of controllable valves to a main line connected to a pump. The reactor is then connected, via a branch line branching off from this main line, to the gas supply with the number of gas reservoirs and to a pump, in the simplest case to the same pump that also evacuates the main line, in order to evacuate the reactor and to exchange the process gas. In this case, the main line exhibits a lower flow resistance in comparison to the branch line with reactor and substrate held therein, and/or a higher gas flow rate or gas exchange rate. Consequently, the inventive method for plasma-supported CVD coating of substrates is based in accordance with this embodiment of the invention on the fact that the substrate is arranged in a reactor, the gas for the plasma coating or plasma treatment being fed to the reactor space via a branch line that is connected to a main line through which a gas supply system provides the gas or gas mixture for the CVD coating, and that exhibits a lower flow resistance in comparison to the branch line with reactor and substrate held therein, and a plasma for the coating or plasma treatment being generated in the process gas in the reactor by means of irradiating electromagnetic energy, and the main line and branch line being pumped out via at least one pump.

In order to carry out plasma coating and, possibly, also plasma treatment for the purpose of changing the layer morphologies, yet another device is, moreover, provided for irradiating electromagnetic energy into the reactor space. As already described, it is preferred to this end to use pulsed electromagnetic energy for PICVD coating, and/or for treating the deposited layers in a pulsed plasma by means of an appropriate device.

An increased flow resistance is, in particular, often to be found when the reactor is designed for internally coating hollow substrates. In this case, the flow resistances are determined chiefly by the dimensions of the substrates, particularly for substrates with small inside diameters.

Owing to the inventive arrangement with main line and branch line, because of the rapid gas exchange at the main line it is also possible for the gas or gas mixture for the plasma coating or plasma treatment to be provided in the reactor at the branch line, despite the higher flow resistance of the latter. For this purpose, the main line can also be regarded as a bypass for lowering the total flow resistance.

The quantity of gas is preferably also handled via a device for controlling pressure and/or quantity on the main line. To this end, pressure can be controlled by means of a pressure measuring device and a control valve, connected in the main line, and with the aid of which the pressure in the main line is set to a desired value as a function of the measured pressure values recorded with the pressure measuring device. In order to keep the total flow resistance as low as possible, it is advantageous here if the control valve is arranged downstream of the junction of the branch line in the flow direction.

The invention is explained below in more detail with the aid of exemplary embodiments and with reference to the drawings, identical and similar elements being provided with the same reference symbols, and the features of various exemplary embodiments being able to be combined with one another.

Figure 1B:
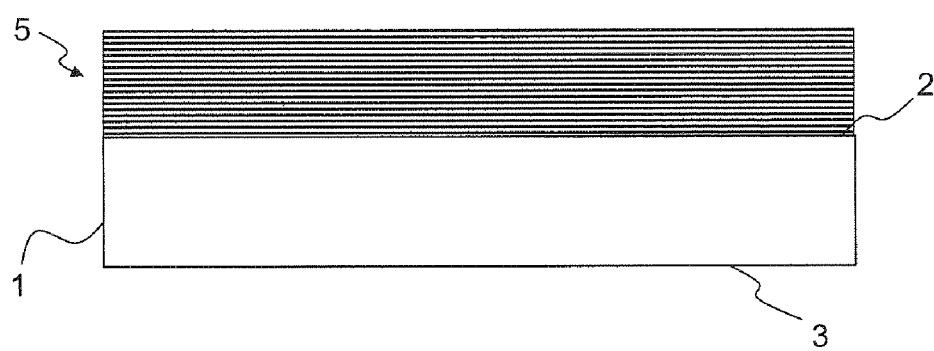
Figure 1C:
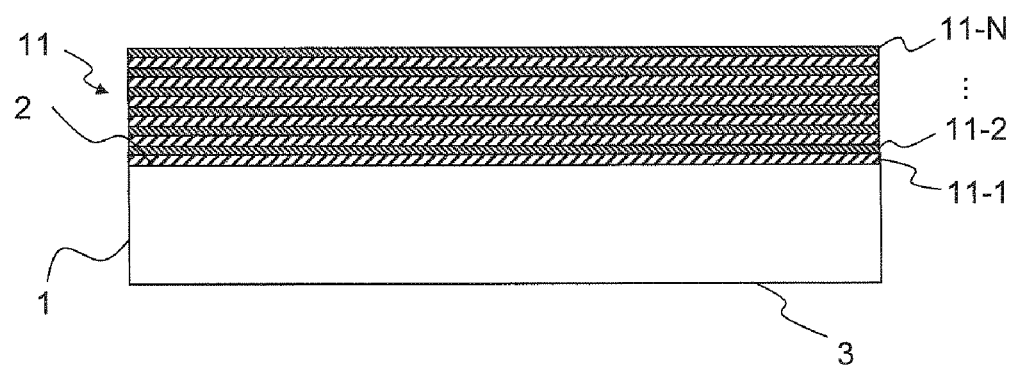
Figure 2:
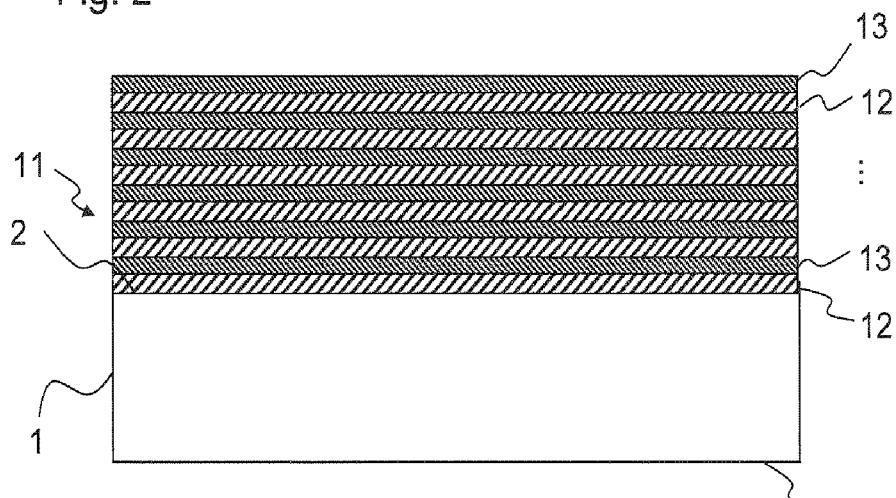
Figure 3:
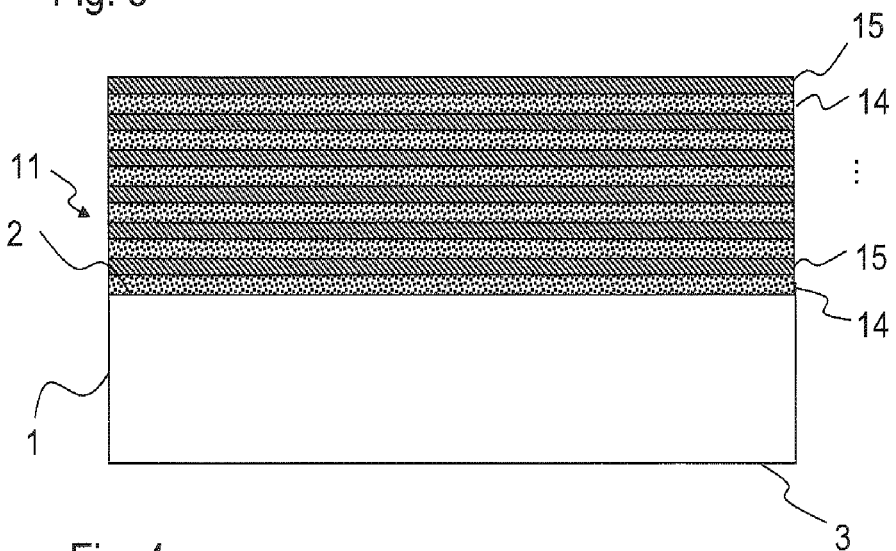
Figure 4:
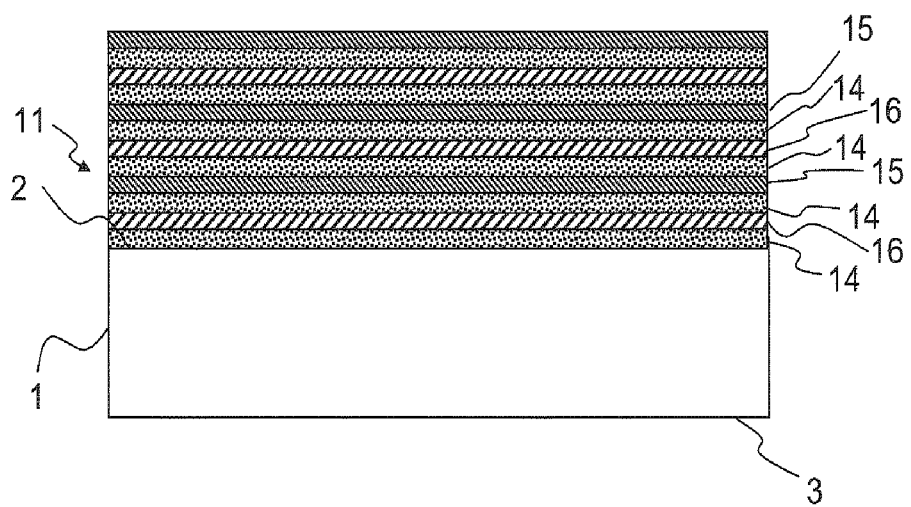
Figure 5A:
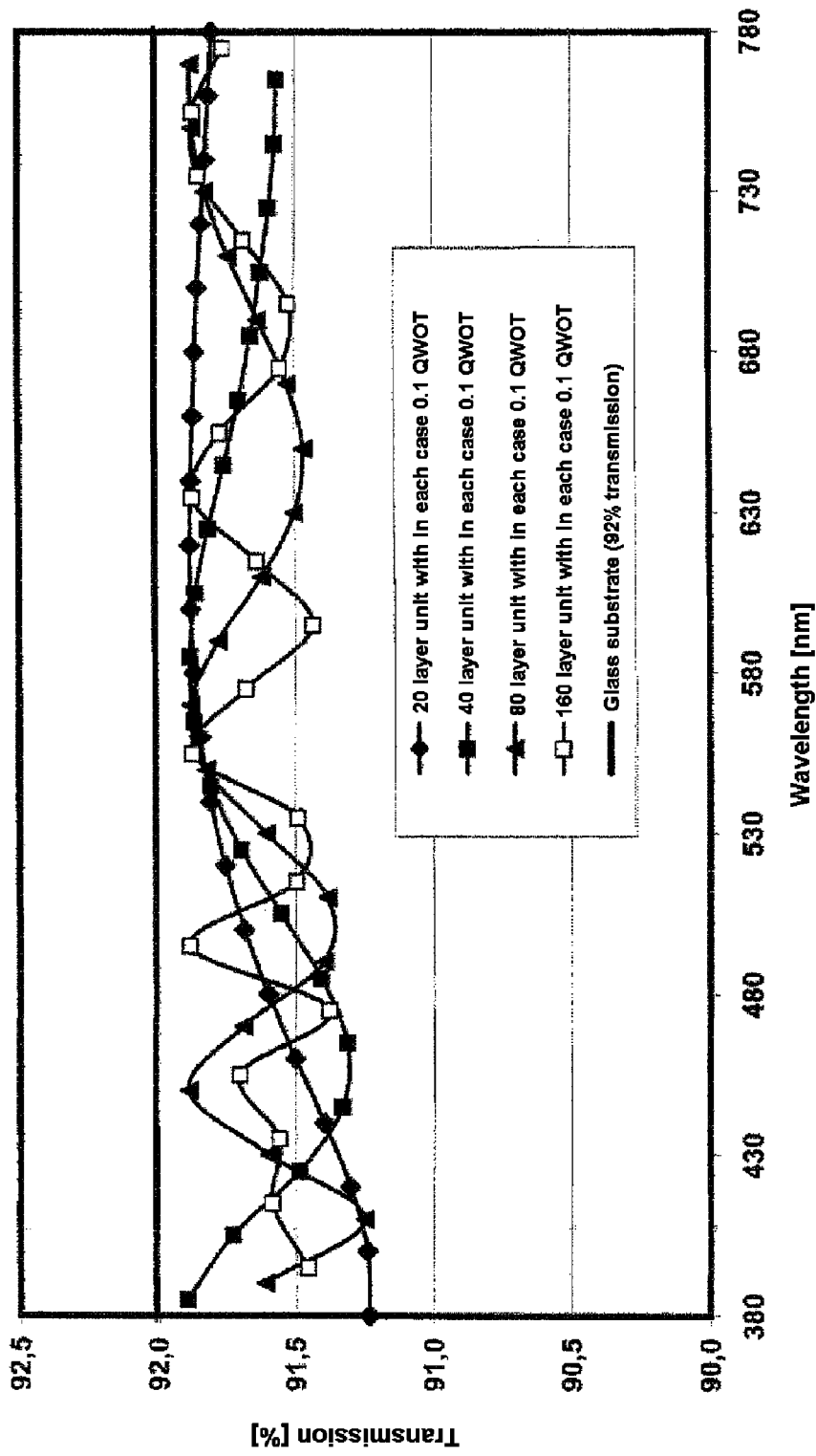
Figure 5C:
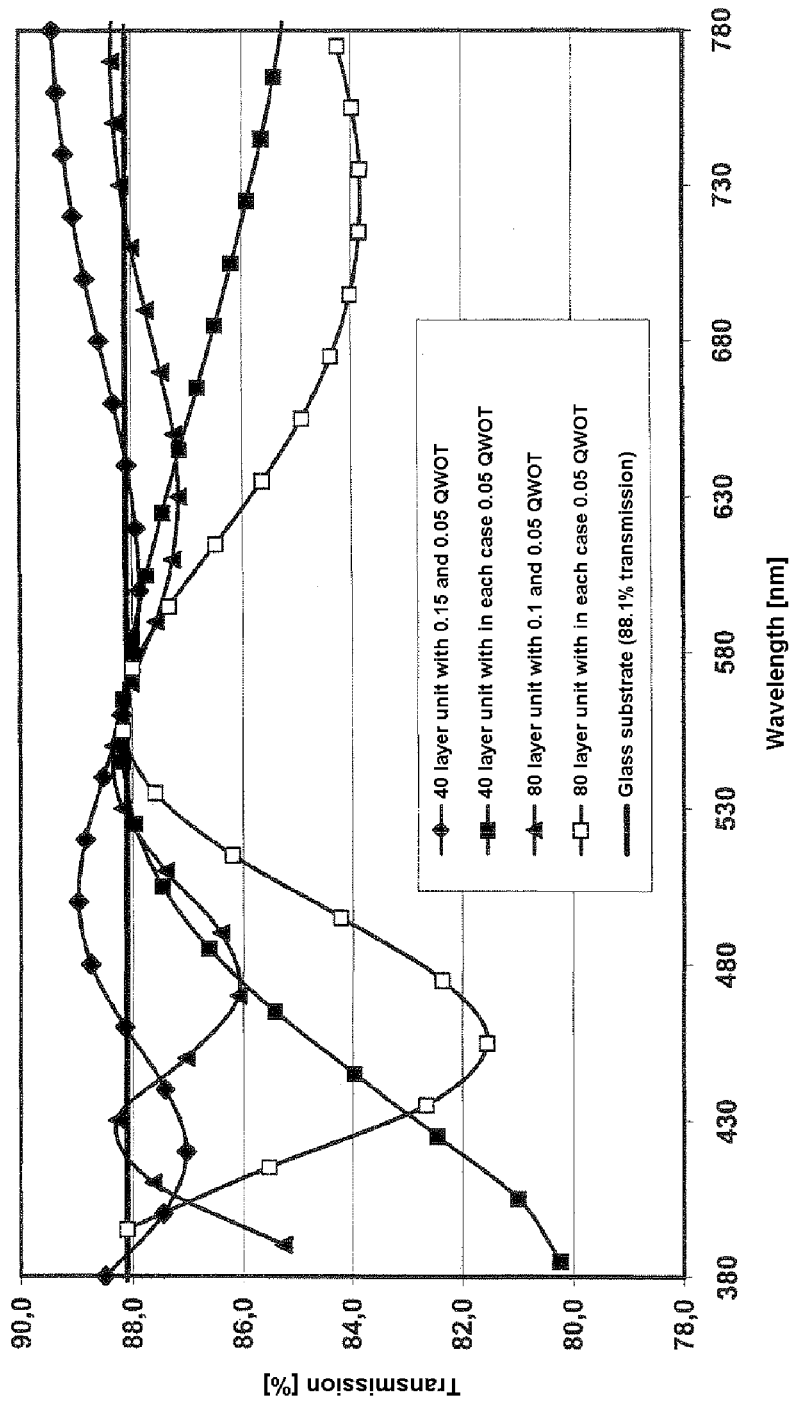
Figure 5D:
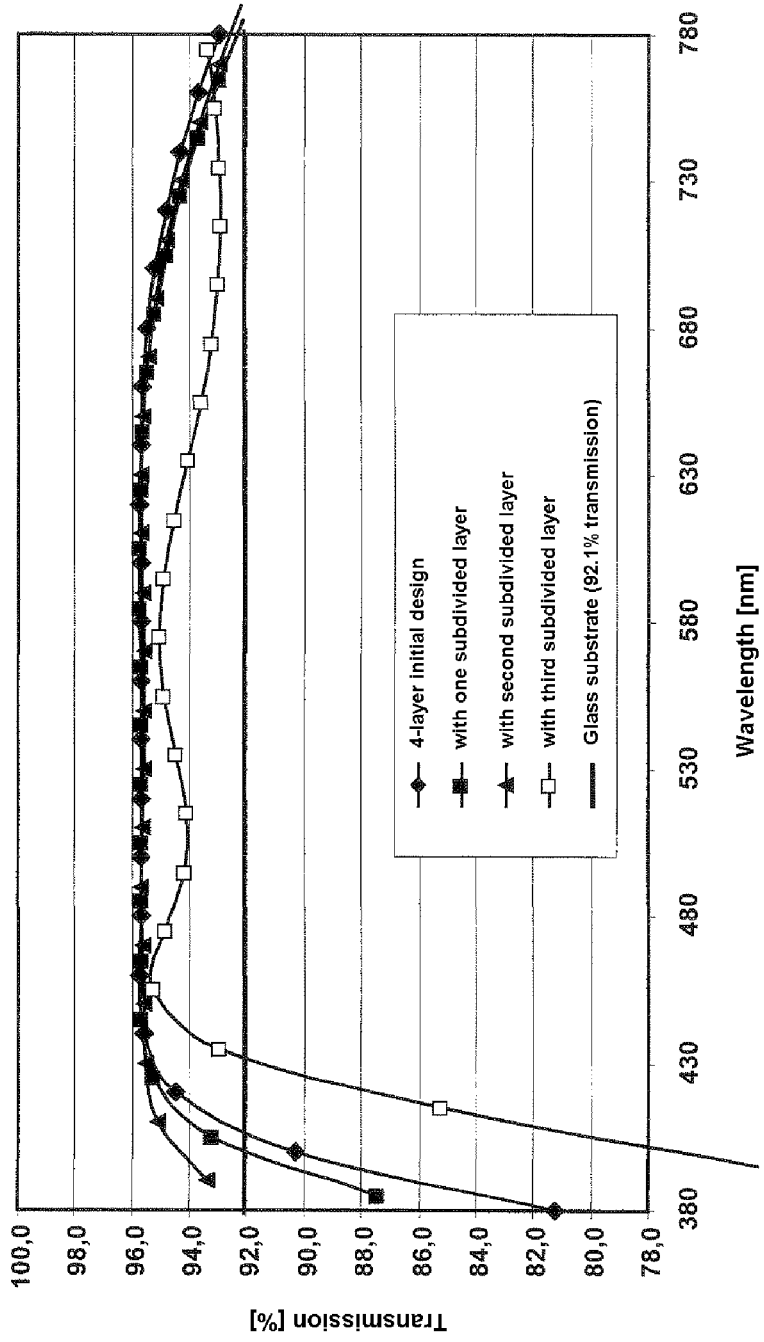
Figure 6:
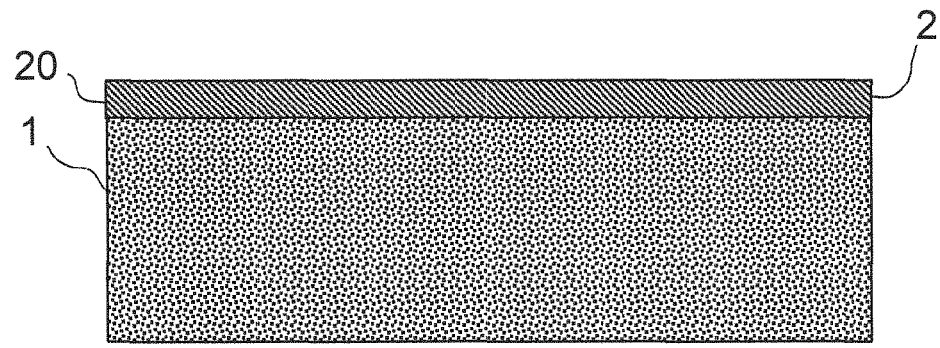
Figure 8:
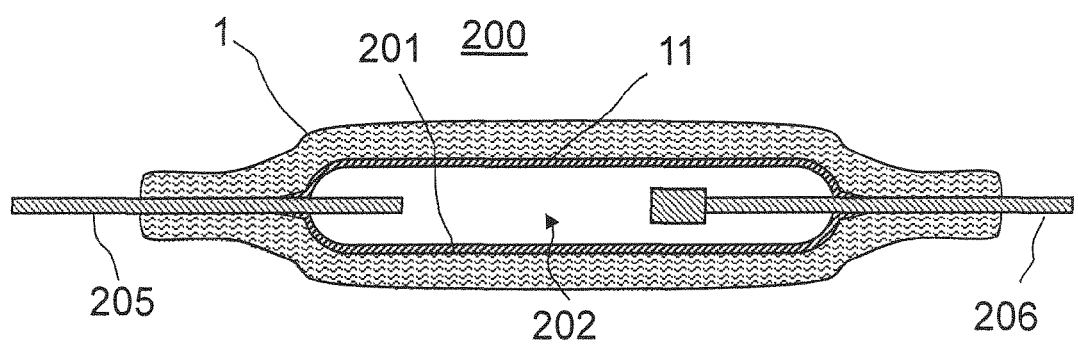
Figure 7:
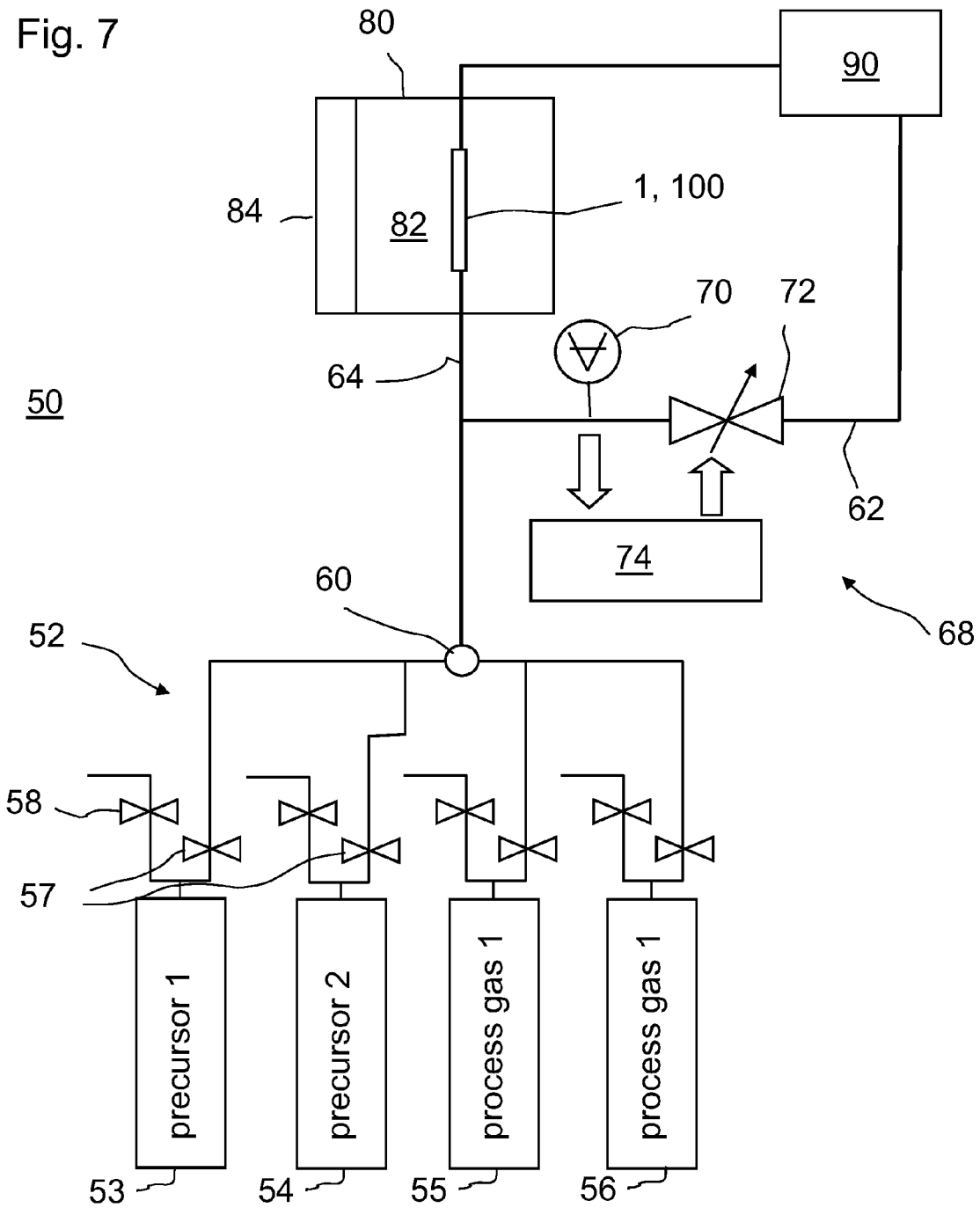

In the drawing:

FIGS. 1A to 1C show various growth modes of coatings, FIG. 1C showing an inventive coating, FIG. 2 shows an exemplary embodiment of an inventively coated substrate having an alternating layer system as barrier coating, FIG. 3 shows an embodiment of the invention having amorphous individual layers, FIG. 4 shows a modification of the example illustrated in FIG. 3, FIGS. 5A to 5D show calculated spectral curves of the transmission of various inventive barrier coatings, FIG. 6 shows a further exemplary embodiment of the invention having a barrier layer in the form of a crystallized substrate surface, FIG. 7 shows an exemplary embodiment of an apparatus for carrying out the coating and plasma treatment, and FIG. 8 shows an exemplary embodiment of an inventively coated lamp bulb.

Various barrier coatings are illustrated in FIGS. 1A to 1C, FIG. 1C showing an embodiment of an inventive fine laminar barrier coating. FIG. 1A shows an individual layer as barrier coating 5 on one side 2 of a substrate 1. This individual layer displays columnar growth, as is to be observed frequently in practice. Here, there are formed on the coated surface 2 of the substrate 1 columnar crystallites 7 with grain boundaries 9 that extend, starting from the substrate surface 2, in the direction of the surface of the barrier coating 5. These grain boundaries oriented precisely in the direction of the substrate in the case of columnar growth are, however, extremely disadvantageous for a targeted high diffusion barrier effect of gas atoms, since the gas atoms preferably move along these grain boundaries.

FIG. 1B shows the ideal case of a barrier coating 5 having one individual layer. Layered growth is present in this barrier coating, the crystal edges or grain boundaries preferably running parallel to the substrate surface such that diffusing gas atoms have no preferred diffusion channels in the direction of the substrate, but only perpendicular thereto. This case of layered growth is, however, scarcely to be achieved in practice. In order to obtain a clean layered growth, there is generally a need, inter alia, for very low deposition rates, and so a coating such as is illustrated in FIG. 1B is already of no interest from economic points of view.

FIG. 1C shows an inventive barrier coating 11 on the substrate 1 with the aid of which it is possible to approximate the properties of a layered growth as illustrated in FIG. 1E. The approximate implementation of the targeted layered growth is achieved according to the invention through coating with a fine laminar multilayer system with thin individual layers 11-1, 11-2, . . . , 11-N. Here, the boundary surfaces produced preferably form interfaces that run parallel to the substrate surface 2 and are thereby precisely very disadvantageous for diffusion of gas atoms through the coating in the direction of the substrate.

Each individual layer of the multiplicity of consecutive individual layers 11-1, 11-2, . . . , 11-N of the barrier coating 11 is, moreover, respectively of a kind differing from a neighboring individual layer, the individual layers having a layer thickness of respectively at most 50 nanometers. The layer thickness of at least a portion of the individual layers 11-1, 11-2, . . . , 11-N is preferably less than 10 nanometers. In particular, a few or all individual layers 11-1, 11-2, . . . , 11-N can even exhibit at most 2 nanometers, preferably also less than 2 nanometers.

In accordance with a further embodiment of the invention, the individual layers 11-1, 11-2, . . . , 11-N or at least a partial layer packet of these individual layers are of a similar kind. In this case, the similar kind relates to the composition and morphology of the layers, but not necessarily also to their thickness.

In accordance with one embodiment of the invention, the individual layers 11-1, 11-2, . . . , 11-N are carried out by deposition, preferably by means of PICVD and a subsequent plasma treatment in order to change the morphology of the thin individual layer respectively last applied. If a targeted crystallization is achieved with the plasma treatment, in particular in a reactive-gas plasma such as, for example, an oxygen plasma, the effect here, as well, of the respectively successive deposition and crystallization is that the crystallites cannot assume, or cannot directly assume a size in the direction perpendicular to the surface that exceeds the layer thickness of the thin individual layers. Conversely, it is also possible in this way to produce amorphous or partially amorphous thick layers when the plasma treatment causes a superficial fusing and the switching off of the electromagnetic energy in order to freeze the fused state.

The individual layers also generally remain capable of being distinguished even in the case of production of a sequence of individual layers of a similar kind. Thus, in the case of crystalline or partially crystalline layers the interface between consecutive individual layers generally remains detectable because of the crystal growth that is uninterrupted at the interface or begins again there. In order to render this structure visible, it would be possible, for example, to carry out an electron microscope examination at an edge.

In the case of individual layers respectively of a different kind, as well, it is, of course, possible to carry out plasma treatment of one or all types of layer in order to influence morphology and/or composition. For example, such a plasma treatment can be used to generate a specific desired crystal phase and/or growth structure in the case of a layer stack with titanium oxide layers. Titanium oxide-containing layers, in particular having consecutive titanium oxide individual layers, or also in combination with different neighboring layers, can also be used as photocatalytically active layers. A barrier effect is not mandatory in this case. Such a coated substrate can serve, for example, as a catalyst. One possible application in this case resides in the catalytic, preferably photocatalytic neutralization of ozone or other pollutants. In order to produce a filter or catalyst, it is also possible here to provide a hollow substrate, in particular with a multiplicity of cavities or channels, for example having a honeycomb cross section, with an inventive fine laminar coating. A fiber material, for example in the form of a nonwoven or fabric, can also be used as substrate in order to enlarge the catalytically active surface. Substrates suitable for this purpose are, in particular, thermostable glass fiber or mineral fiber nonwovens or fabrics.

In order to produce a barrier coating, as illustrated in FIG. 1C, having a multiplicity of consecutively deposited individual layers 11-1, 11-2, . . . , 11-N respectively of a kind differing from or less similar to a neighboring individual layer, and whose layer thickness is respectively at most 50 nanometers, it is preferably possible to use vacuum deposition methods such as sputtering or PICVD. Various methods can also be used in this case in a fashion combined with one another. Inorganic oxide layers, in particular, are preferably deposited as individual layers 11-1, 11-2, . . . , 11-N. Suitable layer materials in this case are, inter alia, $TiO_2$, $ZrO_2$, $SiO_2$, $Al_2O_3$, $Nb_2O_5$, $Ta_2O_5$, $HfO_2$. One or more of the individual layers can also contain mixed oxides, for example, in this case. The barrier coating, in particular in conjunction with glass, glass ceramic or a crystalline material such as, for example, calcium fluoride as substrate material, is preferably deposited in a transparent fashion. However, the invention is also, of course, suitable for other substrate materials, in particular for thermostable materials such as ceramic, metals or semiconductors.

FIG. 2 shows an exemplary embodiment of a coated substrate having a barrier coating 11 with a fine laminar multiple layer system that comprises alternating layers 12, 13 of a different kind. In this exemplary embodiment, the layers 12, 13 respectively exhibit at least partially crystalline, in particular crystalline, with particular preference very finely crystalline structure.

The layers 12 can differ here, for example, in their chemical composition from the layers 13 respectively neighboring them. If PICVD or another chemical vapor deposition method is used, the layers can, for example, be produced in this case during coating by changing the process gas composition such that different metal oxides are respectively deposited.

The respectively similar layers 12 can likewise differ in their morphology from the layers 13 that are their neighbors and are likewise respectively similar. Thus, one embodiment of the invention provides that the layers 11, 12 exhibit similar chemical composition, but differ in their crystal structure, because of a variation in the process parameters during deposition, for example. Again, the layers can respectively differ from the neighboring layers with regard to their growth mode. Thus, for example, the layers 12 can grow in incipient columnar growth, and the layers 13 in layered growth.

FIG. 3 shows an exemplary embodiment of an inventively coated substrate 1 in the case of which the barrier coating 11 comprises individual layers 14 with amorphous structure. In particular, the barrier coating here comprises amorphous individual layers 14 and neighboring, at least partially crystalline, preferably very finely crystalline individual layers 15. Consequently, in this example, as well, the barrier coating is constructed as an alternating layer system with alternating layers 14, 15, the layers 14 respectively being similar, just like the layers 15.

In the case of this embodiment of the invention, as well, the amorphous layers 14 can differ from the respectively neighboring layers 15 through their chemical composition. However, it is likewise possible for the layers 14 and 15 to be chemically similar and to differ—amorphously and in a crystalline fashion—through their morphology. Thus, the layers 14 can be constructed, for example, from amorphous silicon oxide and the layers 15 from crystallized silicon oxide. The amorphously deposited layers 14 can then effectively prevent the formation of relatively large crystallites in the coating 11.

A variant of the example illustrated in FIG. 3 is illustrated in FIG. 4. In the case of the example illustrated in FIG. 4, as well, the barrier coating 11 comprises amorphous individual layers 14. In the example shown in FIG. 4, however, the barrier coating is not constructed as an alternating layer system having two alternating types of layer as in FIG. 2 or FIG. 3. Rather, the barrier coating 11 is constructed from a layer stack with two at least partially crystalline, preferably very finely crystalline layers 15, 16 of a different composition between which an amorphous layer is respectively arranged. The fine laminar structure of the multiple layer packet of the barrier coating 11 with two very finely crystalline layers 15, 16 of a different chemical composition that are respectively separated from one another by an amorphous layer is advantageous for the purpose of preventing undesired interactions between the two crystalline structures of the layers 15, 16, for example the formation of mixed crystals. The amorphous intermediate layer 14 can correspond in this case to the composition of one of the two crystalline layers, or else have another composition.

FIGS. 5A to 5C show calculated spectral profiles of the transmission through inventively coated substrates. Depicted in addition is the transmission of an uncoated glass substrate that was assumed for simplicity to be constant over the wavelength region illustrated. The examples illustrated in FIGS. 5A to 5C are distinguished, inter alia, in that the transparency of the coated substrate corresponds essentially to the transparency of a substrate without the barrier coating. In this case, the light transmission through a coated substrate deviates in the visible spectral region by at most 5% from the transmission of a substrate without the barrier coating. An optical inconspicuousness of the barrier coating is achieved in this way with particular advantage.

FIG. 5A in this case shows calculated spectral curves in transmission of fine laminar layer packets in the form of an alternating layer packet made from two crystalline layer materials. The barrier coating consists here in all the examples of alternating layers made from $SiO_2$ (n=1.455) and $Al_2O_3$ (n=1.62) with 20, 40, 80 and 160 layers on the glass with a refractive index of n=1.52.

The layer thicknesses of the individual layers in the example of FIG. 5A are respectively 0.1 QWOT (Quarter Wave Optical Thickness) at a wavelength of 550 nanometers, that is to say 9.45 nm in each case for $SiO_2$ and 8.5 nm in each case for $Al_2O_3$. The total thicknesses of the layer packets resulting therefrom are 180 nm, 360 nm, 720 nm and 1440 nm. The transmission corresponds approximately to the transmission of the uncoated glass substrate (approximately 92%).

FIG. 5B shows calculated spectral curves in transmission of fine laminar layer packets made from two crystalline layer materials on the example of $SiO_2$ (n=1.455) and $TiO_2$ (n=2.40) with 20 and 40 layers on a high index glass (n=1.67). In the four calculated multiple layer packets of the barrier coating, the layer thicknesses of the individual layers have been adapted in this case so as to result in each case in the highest possible transmission in the region around 550 nm, which is the most sensitive for the human eye. The following layer thicknesses resulted in this case:

a) For the first 20 layer unit: 0.3 QWOT $SiO_2$ in each case, corresponding to 27 nm, and 0.1 QWOT $TiO_2$ in each case, corresponding to 6 nm, total layer thickness approximately 340 nm.

b) For the second 20 layer unit: 0.1 QWOT in each case for both materials, corresponding to 9 nm $SiO_2$, and 6 nm $TiO_2$, total layer thickness approximately 150 nm.

c) For the first 40 layer unit: 0.2 QWOT $SiO_2$, corresponding to 19 nm, and for $TiO_2$ 0.1 QWOT in each case corresponding to 6 nm, total layer thickness approximately 500 nm.

d) For the second 40 layer unit: 0.1 QWOT in each case for both materials, corresponding to 9 nm $SiO_2$ and 6 nm $TiO_2$, total layer thickness approximately 300 nm.

FIG. 5C illustrates calculated spectral curves in transmission of fine laminar layer packets of an inventive barrier coating formed as an alternating layer system with alternating individual layers and made from two crystalline layer materials of the example of $SiO_2$ (n=1.455) and $TiO_2$ (n=2.40) with 40 and 80 layers on a high index glass (n=1.67). The layer thicknesses of the individual layers are in this case respectively exactly half of the layer thicknesses in FIG. 5B. In a departure from the examples illustrated in FIG. 5B, the numbers of the individual layers have to this end respectively been doubled such that the total layer thicknesses of the barrier coatings correspond to those of the examples shown in FIG. 5B.

The following layer thicknesses result in this case:

a) For the first 40 layer unit: 0.15 QWOT in each case for $SiO_2$, corresponding to 14 nm, and 0.05 QWOT in each case for $TiO_2$, corresponding to 3 nm, total layer thickness approximately 340 nm.

b) For the second 40 layer unit: 0.05 QWOT in each case for both materials, corresponding to 4.5 nm $SiO_2$ and 3 nm $TiO_2$, total layer thickness approximately 150 nm.

c) For the first 80 layer unit: 0.1 QWOT for $SiO_2$, corresponding to 9 nm, and for $TiO_2$ 0.05 QWOT in each case, corresponding to 3 nm, total layer thickness just 500 nm.

d) For the second 80 layer unit: 0.05 QWOT in each case for both materials, corresponding to 4.5 nm $SiO_2$ and 3 nm $TiO_2$, total layer thickness approximately 300 nm.

The transmission profiles illustrated in FIGS. 5A to 5C are used below to show that it is possible to pick the selection of the layer materials used for the individual layers of inventive barrier coatings such that the transmission of the overall system in the visible region corresponds to that of an uncoated glass substrate if possible so that the additional barrier protective coating does not give rise to any substantial disadvantages with regard to the transmission of the coated substrate in comparison to an uncoated substrate.

Thus, for example, it is advantageous to select materials for the individual layers whose refractive index is in the vicinity of the refractive index of the glass substrate used. With a typical refractive index n of, for example, approximately n=1.46 for silica glass, n=1.52 for float glass and n=1.6-1.7 for higher index glasses, consideration is given, in particular, to the two layer materials of $SiO_2$ with n=1.42 to 1.46 (depending on coating methods and process parameters) and $Al_2O_3$ (with typically n=1.62).

It is easy with the aid of these two materials to find layer thickness combinations from fine laminar multilayer packets having thin, consecutive individual layers with layer thicknesses of at most 50 nanometers, in particular of at most 10 nanometers or even at most 2 nanometers, whose transmission in the visible region comes very close to that of the uncoated glass substrate. Depending on type of glass, approximately 92% is assumed as transmission of uncoated glass. In this case, as is shown in FIG. 5A the transmission in the visible region is always in the same region as the uncoated glass substrate in a fashion to some extent independent of the number of the layer thicknesses and the thicknesses of the individual layers. The thicknesses of the individual layers could also still be further reduced in FIG. 5A while simultaneously maintaining the total layer thicknesses of the layer packets when this leads to a further improvement in the barrier protective effect without this acting disadvantageously on the level of the transmission in the visible region.

If, by means of changes in the process parameters during the coating operation, it is possible for a layer material to be deposited in two different modifications, for example in the crystalline and amorphous modification such as, for example, very finely crystalline quartz and vitreous amorphous $SiO_2$, it is likewise possible to find very light fine laminar multilayer packets that have virtually no effect on the transmission of the coated glass substrate when the refractive index of the two coating materials is in the vicinity of the refractive index of the substrate, that is to say, in this example, on silica glass or on another low index type of glass.

If it is impossible to find two modifications of a material having refractive indices very similar to that of the glass substrate, two materials can be used which have rather similar refractive indices (see FIG. 5A), or else two materials having clearly different refractive indices (see FIG. 5B and FIG. 5C) when the respective layer thicknesses of the individual layers are in this case adapted with regard to the optical effect of the overall system. Thus, it is possible to coat a high index glass substrate with, for example, n=1.67 in a fine laminar multilayer system with amorphous or very finely crystalline $SiO_2$ layers with, for example, n=1.45, and with very finely crystalline $TiO_2$ layers with, for example, n=2.40, without the transmission of the glass substrate thereby being perceptibly disadvantageously influenced.

In this case, the individual thicknesses in the multilayer packet must be selected in each case such that the transmission is as high as possible in the region around 550 nm of maximum sensitivity for the human eye, while a slight decrease in the transmission for shorter or longer wavelengths does not influence the total impression of the transparency of the coated glass substrate as strikingly for the viewer as is shown in FIG. 5B for a few theoretically calculated possible embodiments, for example.

The layer thickness range of the individual layers used is not associated in this case with a prescribed range in order to achieve a specific optical effect of the coated substrate. In particular, the individual layer thicknesses can also be reduced while simultaneously increasing the number of the individual layers if this is intended to lead to an improvement in the total diffusion barrier effect.

It is shown with the aid of FIG. 5C that the optical effect of the four calculated exemplary embodiments on the transmission of the substrate virtually does not change when the layer thicknesses of the individual layers are respectively halved in the four exemplary embodiments, while the number of the individual layers is, however, doubled in each case. Although the optical effect in the four examples is respectively approximately identical, the influence on the respective level of the diffusion barrier effect of the entire layer system can, however, be substantial because of the increasing number of individual layers.

Otherwise than illustrated in FIGS. 5A to 5C, however, the layers can also be selected such that the barrier coating or an antireflection layer system acts in an antireflective fashion with the barrier coating and it is thereby even possible to attain an increase in the transmission. To this end, an entire layer system acting in an antireflective fashion is produced; in this case at least one layer of the antireflection layer system is implemented by an inventive partial layer packet made from many thin and/or fine laminar individual layers, whose effective refractive index is dimensioned such that the entire layer system acts overall in an antireflective fashion with the barrier coating. The thickness of the individual layers of the partial layer system is in this case at most 50 nanometers, on average, preferably even only at most 10 nanometers.

To this end, the layers can be selected, for example, as to their thickness and composition such that the layer structure of the entire barrier layer corresponds to conditions that it again reaches a maximum in transmission in its overall optical effect in the region, in particular, around 550 nanometers wavelength. This can be achieved according to the invention by replacing the layer sequence required for an antireflection system at least partially by a multiplicity of fine laminar layers. It is possible here, at least partially, to replace the layers, required in the antireflection system, of the layer sequence by multiple layers having an effective refractive index that results from the average of the refractive indices, weighted with the layer thicknesses, of the multiple layers, without there being a noticeable change in the overall optical effect in comparison to the initial design, that is to say without subdivision into many individual layers. The diffusion blocking effect of this inventive layer sequence implemented by many individual layers can, however, be markedly improved in comparison to the initial design considered, which consists in standard terms only of a few relatively thick layers.

By way of example, the antireflection system can be assumed to be a layer system having four layers that is known to the person skilled in the art and can, for example, be implemented using the two layer materials $TiO_2$ (n=2.40) and $SiO_2$ (n=1.445) on a glass substrate with a refractive index of n=1.52. A layer thickness sequence of the four layers that is possible for this purpose can be, for example, (data of the optical layer thickness of the individual layers in QWOT, referred in this case to a reference wavelength of 550 nm):

Substrate (n=1.52)
0.216 QWOT $TiO_2$ (12.5 nm)
0.384 QWOT $SiO_2$ (36.3 nm)
2.030 QWOT $TiO_2$ (116.8 nm)
0.961 QWOT $SiO_2$ (90.8 nm).

The layer system therefore consists of four layers with a total thickness of 256 nm.

FIG. 5D shows the calculated spectral profile for this antireflection system selected by way of example and which acts in an antireflective fashion in the visible region from approximately 420 nm to above 700 nm, and here reaches a mean transmission value of approximately 95.6% in comparison to the uncoated glass substrate (with a transmission of 92.1% for a refractive index n=1.52).

The rear side of the substrate was left uncoated in this consideration, and so a transmission above 96% cannot be reached in this example on principle.

It is then possible according to the invention to replace individual layers, or even all layers of this layer system by a sequence of many individual layers, that is to say an inventive fine laminar structure of individual layers in the case of which the layer considered is replaced by a layer system having an effective refractive index that results from the mean of the refractive indices, weighted with the layer thicknesses, of the multiple layers.

In the example specified, it is possible, for example, to replace the second layer ($SiO_2$) by a sequence of a number of individual layers made from $SiO_2$ and $TiO_2$. It is necessary here for the individual layer thicknesses of $SiO_2$ to be clearly thicker than those made from $TiO_2$ such that it is possible in this layer packet to set an effective refractive index that resembles that of a pure $SiO_2$ layer as far as possible.

If, for example, it is established that the aim is to interrupt the $SiO_2$ layer by three very thin individual layers of $TiO_2$ of thickness precisely 2 nm in each case, and if the layer thicknesses of the other layers are suitable for optimization, the following layer sequence results:

Substrate (n=1.52)
0.150 QWOT $TiO_2$ (8.7 nm)
4 layers 0.104 QWOT $SiO_2$ (9.8 nm), interrupted three times by respectively 2 nm $TiO_2$
1.906 QWOT $TiO_2$ (109.9 nm)
0.946 QWOT $SiO_2$ (89.4 nm).

The layer system now comprises 11 layers with a total thickness of 255 nm, the first eight layers constituting an inventive fine laminar layer structure with a multiplicity of consecutive individual layers with a thickness of less than 10 nanometers.

The calculated spectral profile is likewise illustrated in FIG. 5D. It differs only insubstantially from the considered initial design in the visible region.

Apart from one layer, it is possible according to the invention to replace further layers of a layer sequence by a multiplicity of individual layers for antireflection purposes. In the specified example, it is also possible, in particular, to replace the thickest layer, the 109.9 nm thick $TiO_2$ layer, by a suitably selected sequence of fine laminar individual layers.

If, for example, it is established that the $TiO_2$ layer is to be interrupted by eight layers of $SiO_2$ with a thickness of precisely 2 nm in each case, and if the individual layers obtained in the step just carried out and made from 9.8 nm $SiO_2$ and 2 nm $TiO_2$ are retained and if no more than the first and the last layer of the overall layer packet are additionally permitted to be freely adapted when optimizing with the aid of a layer calculation program, the following layer sequence results:

Substrate (n=1.52)
0.127 QWOT $TiO_2$ (7.3 nm)
4 layers 0.104 QWOT $SiO_2$ (9.8 nm), interrupted three times by in each case 2 nm $TiO_2$
9 layers 0.180 $TiO_2$ (10.4 nm), interrupted eight times by in each case 2 nm $SiO_2$
0.939 QWOT $SiO_2$ (88.7 nm).

The layer system now comprises 27 layers with a total thickness of 252 nm.

The calculated spectral profile is likewise illustrated in FIG. 5D. It likewise differs only insubstantially in the visible region from the initial design considered.

According to the invention, the last layer (89.4 nm $SiO_2$) remaining in the layer system can also still be subdivided into individual layers if the intended diffusion blocking effect of the entire layer system can still be further increased thereby.

If it established, for example, that the $SiO_2$ layer is to be interrupted by six layers of $TiO_2$ respectively 2 nm thick, and if the other individual layers in the entire layer sequence except for the 2 nm thin individual layers are permitted to adapt freely in groups when optimizing with the aid of a layer calculation program, the following layer sequence results:

Substrate (n=1.52)
0.255 QWOT $TiO_2$ (14.7 nm)
4 layers 0.092 QWOT $SiO_2$ (8.7 nm), interrupted three times by in each case 2 nm $TiO_2$
9 layers 0.240 QWOT $TiO_2$ (13.8 nm), interrupted eight times by in each case 2 nm $SiO_2$
7 layers 0.117 QWOT $SiO_2$ (11.1 nm), interrupted six times by in each case 2 nm $TiO_2$.

The layer system consists of 39 layers with a total thickness of 287 nm.

The calculated spectral profile is likewise illustrated in FIG. 5D. It certainly differs clearly from the profile of the considered initial design in the visible region, but still constitutes an effective antireflection system in comparison to the uncoated substrate.

Because of the larger number of individual layers, the diffusion blocking effect of this layer system with 39 layers can be substantially increased in comparison to the previously considered layer system with only 27 layers. This layer system can be advantageous with regard to the inventive effect even when the antireflection effect of the diffusion barrier layer of this example is no longer quite as good as that from the previous examples.

FIG. 6 shows an exemplary embodiment in accordance with a further embodiment of the invention having a barrier layer in the form of a crystallized substrate surface. In this exemplary embodiment, an amorphous metal oxide substrate 1 is used, and a barrier layer 20 made from the substrate material itself is formed on the surface 2 of the substrate 1. It is preferred to use amorphous silicon oxide as substrate material. The amorphous substrate material is, in particular, transformed by crystallization in order to form the barrier layer 20. This transformation takes place essentially only in a region very near the surface and with the formation of very small crystallites with an average size of up to at most 50 nanometers, preferably at most 10, or even only at most 2 nanometers. In comparison to amorphous silicon oxide, crystallized silicon oxide has a better diffusion blocking effect, and so the layer 20 protects deeper regions of the substrate 1 against the action of harmful gas components.

The crystallization of the substrate material in the layer 20 is achieved by superficial heating up of the surface 2 of the substrate 1 to beyond the required crystallization temperature. The surface 2 of the substrate 1 is plasma treated to this end. Very high temperatures are reached in a plasma. Since, because of the low gas density of a low-pressure plasma preferably used, the energy input is, on the other hand, only slight, it is only essentially a surface region of little depth that is heated up in this way, and so the formation of a crystallized layer comes about only at the surface of the substrate 1. The plasma treatment can be, for example, a reactive plasma etching of the surface of the substrate with the aid of which the substrate surface is simultaneously cleaned by the action of, for example, fluorine and/or oxygen ions. Various volatile fluorine-containing substances such as tetrafluoromethane or other fluorinated hydrocarbons, for example, can be used for the process gas. It is also advantageously possible to add oxygen. Plasma etching or dry etching is also known from semiconductor technology and microtechnology for the purpose of structuring surfaces. In the case of such plasma treatment, an activation of the surface can advantageously also further be achieved simultaneously, such that a substrate treated in such a way is still also very well suited for carrying out additional coatings that then adhere particularly effectively to the substrate 1. What is also conceived here, in particular, are inventive fine laminar barrier coatings 11 such as have been described by way of example with the aid of FIGS. 1C to 5D.

FIG. 7 is a schematic of an apparatus 50 for CVD coating of substrates 1 having a multiplicity of consecutive thin layers. The apparatus comprises a reactor 80 that is designed, in particular, for internal coating of hollow substrates, tubes 100 here, by way of example. To this end, the reactor 80 is designed with an appropriate holder for holding the tubes and conducting the gas for the CVD coating, and optionally for plasma treatment of applied layers through a tube 100. The apparatus 50 is based on the fact that a gas supply 52 having a number of gas reservoirs in the form of containers 53-56 is connected by means of controllable valves 57 to a main line 62 connected to a pump 90, and that the reactor 80 for CVD coating is connected, via a branch line 64 branching off from this main line 62, to the gas supply 52 and to the pump 90, in order to evacuate the reactor and to exchange the process gas. The main line 62 in this case exhibits a lower flow resistance in comparison to the branch line 64 with reactor 80 and tube 100 held therein. The flow resistance through branch line 64, reactor 80 and tube 100, which is higher in comparison to the main line 62, is caused in this case chiefly or solely by the small inside diameter of the tube 100.

Provided furthermore at the reactor 80 is a further device, for irradiating electromagnetic energy into the reactor space in order to generate the plasma in the gas fed, in the form of a microwave head 84 that is preferably operated in a pulsed fashion in order to deposit the layers by means of PICVD and, optionally, to carry out an additional plasma treatment in order to change the layer morphologies of the previously deposited thin individual layers.

In the example shown in FIG. 7, the gas supply system 52 has two gas containers 53, 54 with precursor gases for layer deposition in each case, as well as two further gas containers 55, 56 for process gases. The process gases can be, for example, an inert gas for adding to one of the precursor gases, and a reactive gas, in particular oxygen. If the aim is to deposit titanium oxide and/or silicon oxide layers, the gas containers 53, 54 can make use, for example, of HMDSO (hexamethyldisiloxane) for deposition of silicon oxide layers, and titanium chloride for deposition of titanium oxide layers. The controllable valves 57 are then used to generate a prescribed gas composition at the gas mixing point 60 at the start of the main line 62.

The further valves 58 serve for maintenance, for example in order to flush and evacuate the incoming lines as far as the valves 57 after a change of gas container.

The gas quantity in the main line is fed through by means of a pressure controller 68. The latter comprises a control 74, a pressure measuring device 70 and a control valve 72 connected in the main line 62. The control 74 of the pressure controller 68 is then used to set the pressure in the main line 62 to a desired value as a function of the measured pressure values recorded with the pressure measuring device 70, by driving the control valve.

Owing to the low flow resistance of the main line 62, it is also possible at the junction of the branch line 64 with the main line 62 to carry out very quickly a change of the gas or gas mixture for the purpose of producing individual layers of a different kind, and/or a plasma treatment of previously deposited layers, in particular in a reactive gas, in order to alter the morphology thereof.

The level of the gas flow through the substrate 100 in the branch line branching off from the main line 62 is then yielded as a function of the flow resistances through the narrow tube, on the one hand, and through the main line, on the other hand, that is to say, in particular, as a function of the effective opening cross sections of the two gas flow branches.

In addition to the deposition of barrier coatings on the inside of tubes, the apparatus can also be used to deposit photocatalytically active layer stacks having an inventive fine laminar structure with a layer thickness of the individual layers of at most 50 nanometers. Such tubes coated on the inside and/or outside can then, for example, be combined to form a catalytically active air or exhaust gas filter, for example in order to reduce ozone for use in motor vehicles. Again, fiber materials such as glass fiber or mineral fiber nonwovens or fabrics as substrate can be coated in the previously described apparatus with inventive fine laminar coatings, for example likewise for applications as catalyst.

FIG. 8 shows an example of a lamp 200 having a substrate 1 in the form of a coated lamp bulb. As was described with the aid of FIG. 7, the first step for producing such a lamp is to coat a tubular substrate, or tube 100, on the inside. To this end, it is expedient to produce a lamp 200 by using a glass tube, for example made from silica glass. Subsequently, the connecting wires 205, 206 are inserted into the open tube ends, and the ends are then softened up by heating and pinched so as to form a sealed cavity 202 whose inside is provided with the inventive fine laminar barrier layer 11. This procedure, that is to say first undertaking the internal coating and then forming from the tube a cavity that is sealed at one end, or at both ends as in this example, is advantageous in order to obtain a satisfactory throughflow of the gas or the gases for the coating. The sequence of the steps of internal coating and pinching is to be detected on the finished lamp by, inter alia, the fact that in the pinched region, where the inner surface 201 impinges on the fused connecting wires, the internal coating is drawn into the substrate 1 because of the deformation.

It is clear to the person skilled in the art that the invention is not limited to the above-described exemplary embodiments. Rather, the exemplary embodiments can be changed in manifold ways and, in particular, it is also possible to combine the features of the individual exemplary embodiments with one another.

The invention claimed is:

1. A coated substrate defined by a coating having a multiplicity of consecutive individual layers respectively of a kind differing from or similar to a neighboring individual layer, the individual layers exhibiting a layer thickness of respectively at most 50 nanometers, wherein the substrate is a tube that is hot pinched after coating with the formation of a sealed cavity, wherein the coating comprises at least one partial layer packet having individual layers of the same composition but different morphology.

2. The coated substrate as claimed in claim 1, wherein at least one of the individual layers exhibit a layer thickness of at most 10 nanometers.

3. The coated substrate as claimed in claim 1, wherein at least one of the individual layers exhibit a layer thickness of at most 2 nanometers.

4. The coated substrate as claimed in claim 1, wherein at least one individual layer of the coating differs from a neighboring individual layer in its chemical composition.

5. The coated substrate as claimed in claim 1, wherein at least one of the individual layers exhibits crystalline structure.

6. The coated substrate as claimed in claim 5, defined by a layer having a number of consecutive, similar crystalline layers.

7. The coated substrate as claimed in claim 1, wherein at least one individual layer of the coating differs from a neighboring individual layer in its morphology.

8. The coated substrate as claimed in claim 7, wherein the individual layer differs from a neighboring individual layer by its crystal structure.

9. The coated substrate as claimed in claim 1, wherein the individual layers differ from one another in their growth mode.

10. The coated substrate as claimed in claim 1, wherein at least one of the individual layers exhibits an amorphous or at least partially amorphous structure.

11. The coated substrate as claimed in claim 10, defined by a layer having a number of consecutive, similar, at least partially amorphous layers.

12. The coated substrate as claimed in claim 1, wherein the coating comprises at least one partial layer packet having alternating layers of a different nature.

13. The coated substrate as claimed in claim 1, wherein the coating comprises at least one partial layer packet having amorphous and neighboring, at least partially crystalline layers.

14. The coated substrate as claimed in claim 1, wherein the coating comprises at least one partial layer packet having two at least partially crystalline layers of a different composition, between which respectively one amorphous layer is arranged.

15. The coated substrate as claimed in claim 1, wherein the coating is transparent.

16. The coated substrate as claimed in claim 15, wherein the transparency of the coating corresponds to the transparency of the substrate.

17. The coated substrate as claimed in claim 15, wherein the light transmission through a coated substrate deviates in the visible spectral region by at most 5% from the transmission of a substrate without the coating.

18. The coated substrate as claimed in claim 1, defined by a transparent substrate.

19. The coated substrate as claimed in claim 1, wherein the refractive index of the coating corresponds to the refractive index of the substrate surface, or deviates therefrom by at most 5%.

20. The coated substrate as claimed in claim 1, defined by an antireflection layer system having the coating, the entire layer system acting in an antireflective fashion and at least one layer of the antireflection layer system comprising a partial layer packet that has a multiplicity of thin consecutive layers with an average thickness of the individual layers of at most 50 nanometers, and whose effective refractive index is dimensioned such that the antireflection layer system acts overall in an antireflective fashion.

21. The coated substrate as claimed in claim 1, wherein at least one of the individual layers contain inorganic oxides.

22. The coated substrate as claimed in claim 1, wherein at least one of the individual layers contains at least one of the oxides $TiO_2$, $ZrO_2$, $SiO_2$, $Al_2O_3$, $Nb_2O_5$, $Ta_2O_5$, $HfO_2$.

23. The coated substrate as claimed in claim 1, wherein the substrate comprises at least one of the materials of glass, glass ceramic, ceramic, metal, semiconductor, a crystalline material.

24. The coated substrate as claimed in claim 1, wherein the substrate is hollow.

25. The coated substrate as claimed in claim 24, wherein the substrate is internally coated.

26. The coated substrate as claimed in claim 1, wherein the substrate is tubular.

27. The coated substrate as claimed in claim 1, wherein the coating is catalytically active.

28. The coated substrate as claimed in claim 27, distinguished by titanium oxide-containing photocatalytically active individual layers.

* * * * *

UNITED STATES PATENT AND TRADEMARK OFFICE
CERTIFICATE OF CORRECTION

PATENT NO. : 8,435,650 B2
APPLICATION NO. : 11/721802
DATED : May 7, 2013
INVENTOR(S) : Mehrtens et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1704 days.

Signed and Sealed this
Eighth Day of September, 2015

Michelle K. Lee
*Director of the United States Patent and Trademark Office*